United States Patent
Miller et al.

(10) Patent No.: US 10,579,307 B2
(45) Date of Patent: Mar. 3, 2020

(54) CORRECTING POWER LOSS IN NAND MEMORY DEVICES

(71) Applicant: Micron Technology, Inc., Boise, ID (US)

(72) Inventors: Michael G. Miller, Boise, ID (US); Kishore Kumar Muchherla, Fremont, CA (US); Harish Reddy Singidi, Fremont, CA (US); Sampath Ratnam, Boise, ID (US); Renato Padilla, Jr., Folsom, CA (US); Gary F. Besinga, Boise, ID (US); Peter Sean Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/566,545

(22) Filed: Sep. 10, 2019

(65) Prior Publication Data
US 2020/0004465 A1 Jan. 2, 2020

Related U.S. Application Data

(63) Continuation of application No. 15/693,121, filed on Aug. 31, 2017, now Pat. No. 10,430,116.

(51) Int. Cl.
*G06F 3/06* (2006.01)
*G11C 16/10* (2006.01)
*G11C 16/08* (2006.01)

(52) U.S. Cl.
CPC .......... *G06F 3/0659* (2013.01); *G06F 3/0619* (2013.01); *G06F 3/0679* (2013.01); *G11C 16/10* (2013.01); *G11C 16/08* (2013.01)

(58) Field of Classification Search
CPC .... G06F 3/0659; G06F 3/0679; G06F 3/0619; G11C 16/10; G11C 16/08
See application file for complete search history.

(56) References Cited

U.S. PATENT DOCUMENTS

| | | | |
|---|---|---|---|
| 8,365,030 B1 * | 1/2013 | Choi | G06F 11/1048 714/746 |
| 2011/0258487 A1 | 10/2011 | Royer et al. | |
| 2014/0063940 A1 | 3/2014 | Chen et al. | |
| 2015/0085575 A1 * | 3/2015 | Tam | G11C 29/50004 365/185.11 |

(Continued)

OTHER PUBLICATIONS

"How Micron SSDs Handle Unexpected Power Loss", MIcron, 4 pgs.
(Continued)

*Primary Examiner* — Mohammed A Bashar
(74) *Attorney, Agent, or Firm* — Schwegman Lundberg & Woessner, P.A.

(57) ABSTRACT

Devices and techniques for correcting for power loss in NAND memory devices are disclosed herein. The NAND memory devices may comprise a number of physical pages. For example, a memory controller may detect a power loss indicator at the NAND flash memory. The memory controller may identify a last-written physical page and determine whether the last-written physical page comprises more than a threshold number of low-read-margin cells. If the last-written physical page comprises more than the threshold number of low-read-margin cells, the memory controller may provide a programming voltage to at least the low-read-margin cells.

20 Claims, 9 Drawing Sheets

(56) References Cited

U.S. PATENT DOCUMENTS

2015/0117107 A1     4/2015   Sun et al.
2018/0102790 A1*   4/2018   Oh .................... G11C 16/26
2019/0065108 A1     2/2019   Miller et al.

OTHER PUBLICATIONS

"Open NAND Flash Interface Specification Revision 2.1", ONFi, (Jan. 14, 2009), 206 pgs.

"Powerloss protection (PLP)", Samsung Electronics Co., (2014), 4 pgs.

"TN-29-07: Small-Block vs. Large-Block NAND Flash Devices", Micron, (2005), 14 pgs.

"TN-29-28: Memory Management in NAND Flash Arrays", Micron, (2005), 10 pgs.

Keating, Kim, et al., "AN1827 Programming and Erasing Flash Memory on the MC68HC908AS60", NXP Freescale Semiconductor, (2004), 60 pgs.

Parnell, Thomas, "NAND Flash Basics & Error Characteristics; Why Do We Need Smart Controllers?", IBM Flash Memory Summit, (2016), 20 pgs.

Pozidis, Haralampos, et al., "Usong adaptive read voltage thresholds to enhance the reliability of MLC NAND flash memory systems", Research Gate, (May 2014), 7 pgs.

Tseng, Hung-Wei, et al., "Understanding the Impact of Power Loss on Flash Memory", The Department of Computer Science and Engineering University of California, San Diego Copyright ACM ACM 978-1-4503-0636-2, (2011), 6 pgs.

* cited by examiner

CORRECTING POWER LOSS IN NAND MEMORY DEVICES

PRIORITY APPLICATION

This application is a continuation of U.S. application Ser. No. 15/693,121, filed Aug. 31, 2017, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.), SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

A flash memory device can deviate from its intended programming if it suffers a power loss during programming. Some flash memory devices include power loss capacitors or other charge storage devices intended to permit the flash memory device to complete a programming cycle that is in-progress when an unexpected power loss occurs. In many devices, however, it is not cost effective to include these charge storage devices. This can lead to asynchronous power losses (APLs) where programming ends abruptly, leaving portions of the flash memory device incorrectly programmed and effectively corrupted.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
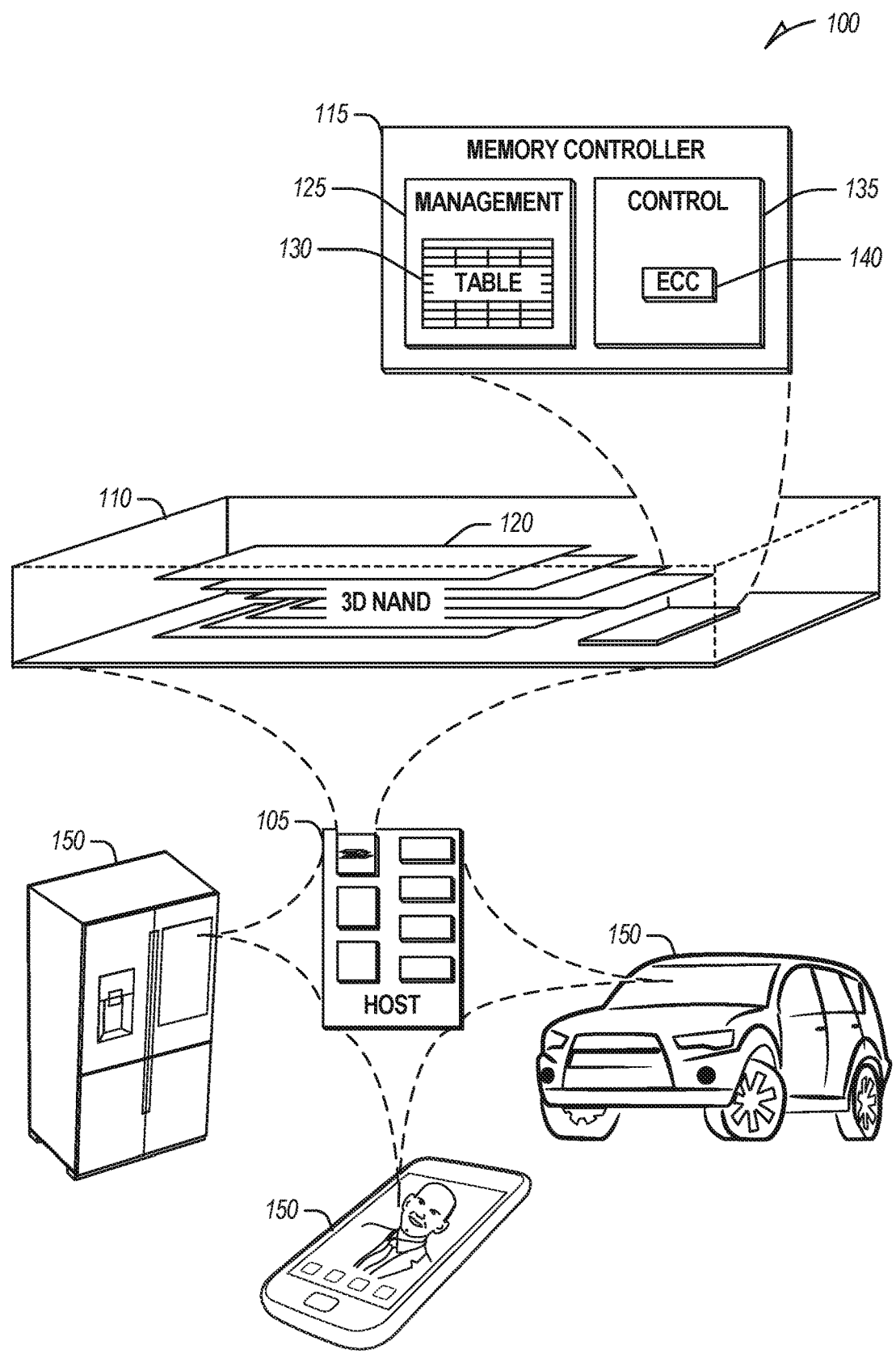
FIG. 1 illustrates an example of an environment including a memory device.

Various examples described herein are directed to systems and methods for managing NAND flash memory, for example, by correcting for asynchronous power loss (APL). A memory controller detects, for example, upon initialization, when a programming cycle of the flash memory device was interrupted by an APL. When an APL is detected, the memory controller determines a last-written physical page, which is the last physical page to which the memory controller wrote (e.g., before the APL). For example, the last physical page to have been written before the APL may have been corrupted during the APL. The memory controller determines if the last-written physical page is corrupted and, if so, may correct the last-written physical page by providing a programming voltage to some or all of the cells of the last-written physical page. In some examples, the memory controller provides the programming voltage to cells of the last-written physical page that are at a logical state corresponding to a highest threshold voltage distribution.

Consider an example MLC flash memory cell that can store more than one bit (e.g., 2 bits, 3 bits, etc.). The MLC cell is programmable to at least four logical states. The logical states are realized by changing the level of charge on the cell in a manner that affects its threshold voltage. The threshold voltage of a cell is the lowest voltage applied to the cell's control gate that will cause the cell to conduct current on its bit line. In various example arrangements, adding or removing charge from a cell causes the cell's threshold voltage to change. For example, in many NAND flash memory cells, adding charge to the cell increases the threshold voltage. Different logical states in a cell are indicated by different distributions of threshold voltages, also called threshold voltage distributions. A threshold voltage distribution is a distribution of threshold voltages that correspond to a particular logical state. For example, a first threshold voltage distribution may correspond to a first logical state. A second threshold voltage distribution may correspond to a second logical state, and so on.

The memory controller reads a cell by applying one or more read levels to the cell's control gate and then testing to determine if the cell conducts current on its bit line. If the cell conducts current on its bit line, then the threshold voltage is lower than the read level. If the cell is an open circuit on the bit line, then its threshold voltage is higher than the read level. Read levels are positioned between threshold voltage distributions for different logical states. For example, a first read level may be positioned between a first threshold voltage distribution that is the highest threshold voltage for the cell and a second threshold voltage distribution that is the next-highest. In this example, if the cell is an open circuit at the first read level, then the cell is at the logical state corresponding to the first threshold voltage distribution. If the cell conducts current at the first read level, then it is at a logical state corresponding to a lower threshold voltage. The memory controller then applies a second read level that is between the second threshold voltage distribution and a third threshold voltage distribution that is next-highest relative to the second threshold voltage. If the cell is an open circuit at the second read level, then it is at the logical state corresponding to the second threshold voltage distribution. If the cell conducts current at the second read level, then it is at a logical state corresponding to yet a lower threshold voltage. The memory controller may proceed in this manner, applying progressively lower read levels until it determines the logical state of the cell. It will be appreciated that other techniques for applying read levels may be used instead of those described in this example. For example, the memory controller may begin with a lowest read level and apply progressively higher read levels, if necessary. In another example, the memory controller may begin with a middle read level and then apply progressively higher or lower read levels until the state of the cell is determined.

As described herein, NAND flash memory cells are arranged into physical pages, where the control gates cells making up a physical page are tied to a common word line. The memory controller may read the cells in a physical page in parallel. For example, the memory controller applies the read levels to the word line for the physical page and then examines the bit lines to determine which, if any, of the cells conduct current at each read level.

A physical page is programmed at a programming cycle. During the programming cycle, a programming voltage is provided to the cells making up the physical page, for example, on a word line for the cell. The programming voltage may be applied continuously, or as a series of voltage pulses. As described herein, cells of the physical page that are targeted for programming have their respective bit lines tied to ground or another suitable potential. Cells that are not targeted for programming have their respective bit lines tied to an inhibit voltage that prevents the cells from accumulating charge as a result of the programming voltage.

The programming voltage is provided to different cells for different levels of time, for example, depending on the intended logical state for the cell. For example, cells that are to be programmed to logical states corresponding to lower threshold voltage distributions may receive the programming voltage for less time (e.g., fewer pulses) than cells that are to be programmed to logical states corresponding to higher threshold voltage distributions. Accordingly, when programming is interrupted, cells that were to be programmed to logical states corresponding to lower threshold voltage distributions are more likely to be completely programmed. On the other hand, cells that were to be programmed to logical states corresponding to higher threshold voltage distributions are more likely to have not received sufficient charge to reach the desired threshold voltage distributions.

In the various examples described herein, a memory controller may identify cells at the last-written physical page that are at a first logical level corresponding to a highest threshold voltage distribution. As described herein, these cells are most likely to have suffered from incomplete programming prior to the APL. The memory controller may determine a read margin for these cells. The read margin indicate a difference between a low side of the threshold voltage distribution on the cells and a first read level. If the read margin is less than a threshold, the memory controller may provide the programming voltage to the cells at the first logical level. This "touch up" programming voltage may shift the threshold voltage distribution for the cells upwards, which may render the cells readable. In this way, some physical pages that suffer APL during programming may be recovered without loss of data.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 1100 of FIG. 11.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable logical states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
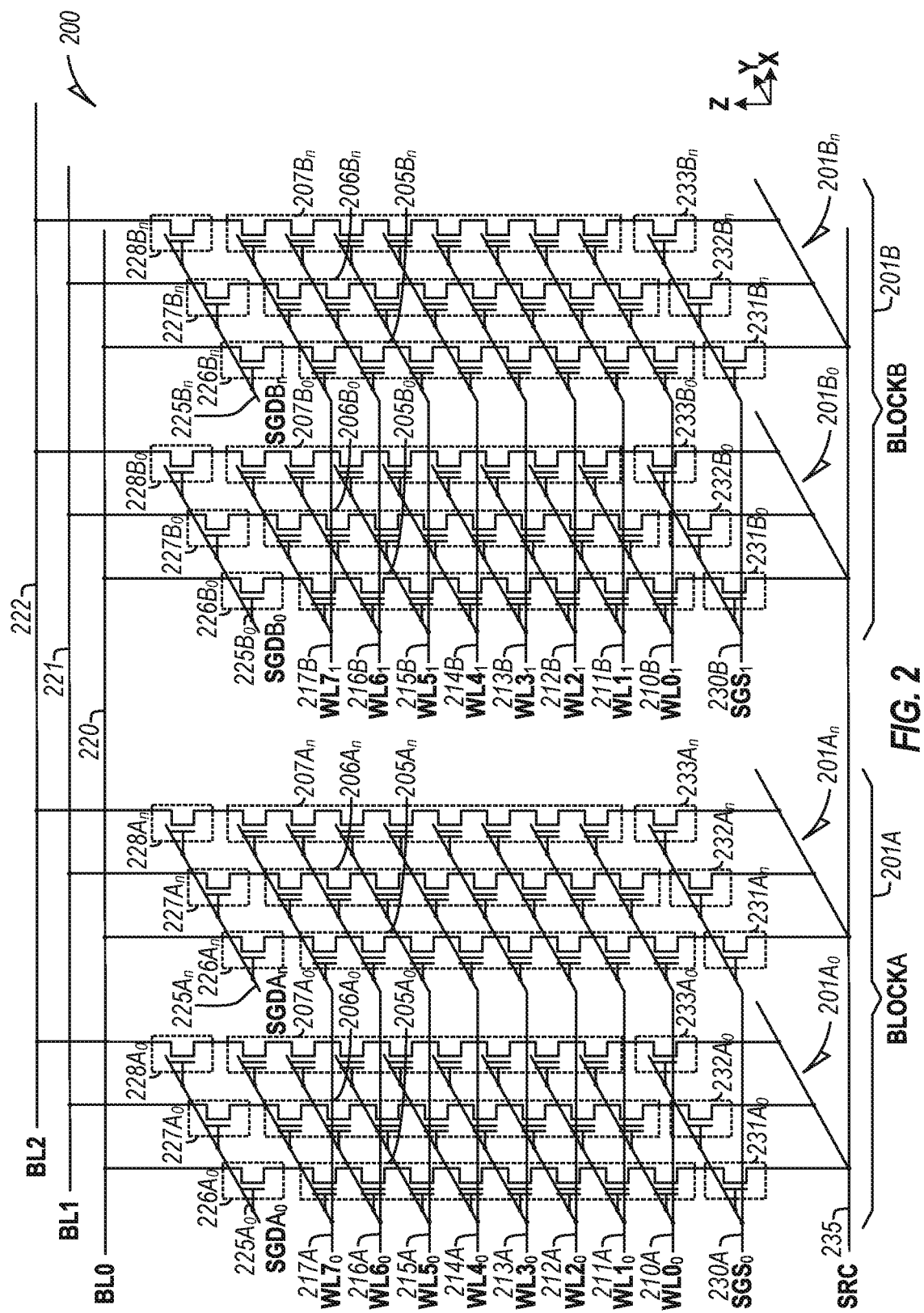
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines—BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate coupled to (e.g., electrically or otherwise operatively connected to) an access line (e.g., word lines $WL0_0$-$WL7_0$ 210A-217A, $WL0_1$-$WL7_1$ 210B-217B, etc.), which collectively couples the control gates across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates of each memory cell or select gate (or a portion of the control gates or select gates) of a respective tier of the array. Specific strings of memory cells in the array can be accessed, selected, or controlled using a combination of bit lines and select gates, etc., and specific memory cells at one or more tiers in the specific strings can be accessed, selected, or controlled using one or more access lines (e.g., word lines).

Figure 3:
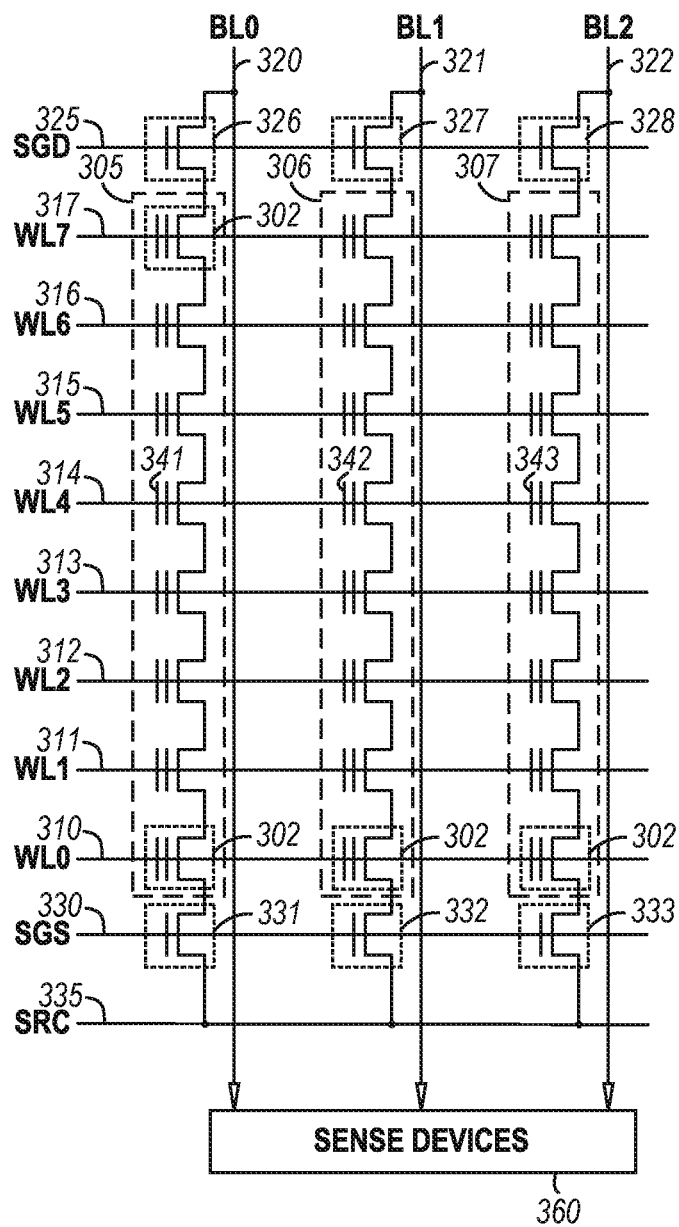

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines BL0-BL2 320-322) using a respective drain-side select gate (SGD) (e.g., first-third SGD 326-328). Although illustrated with 8 tiers (e.g., using word lines WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
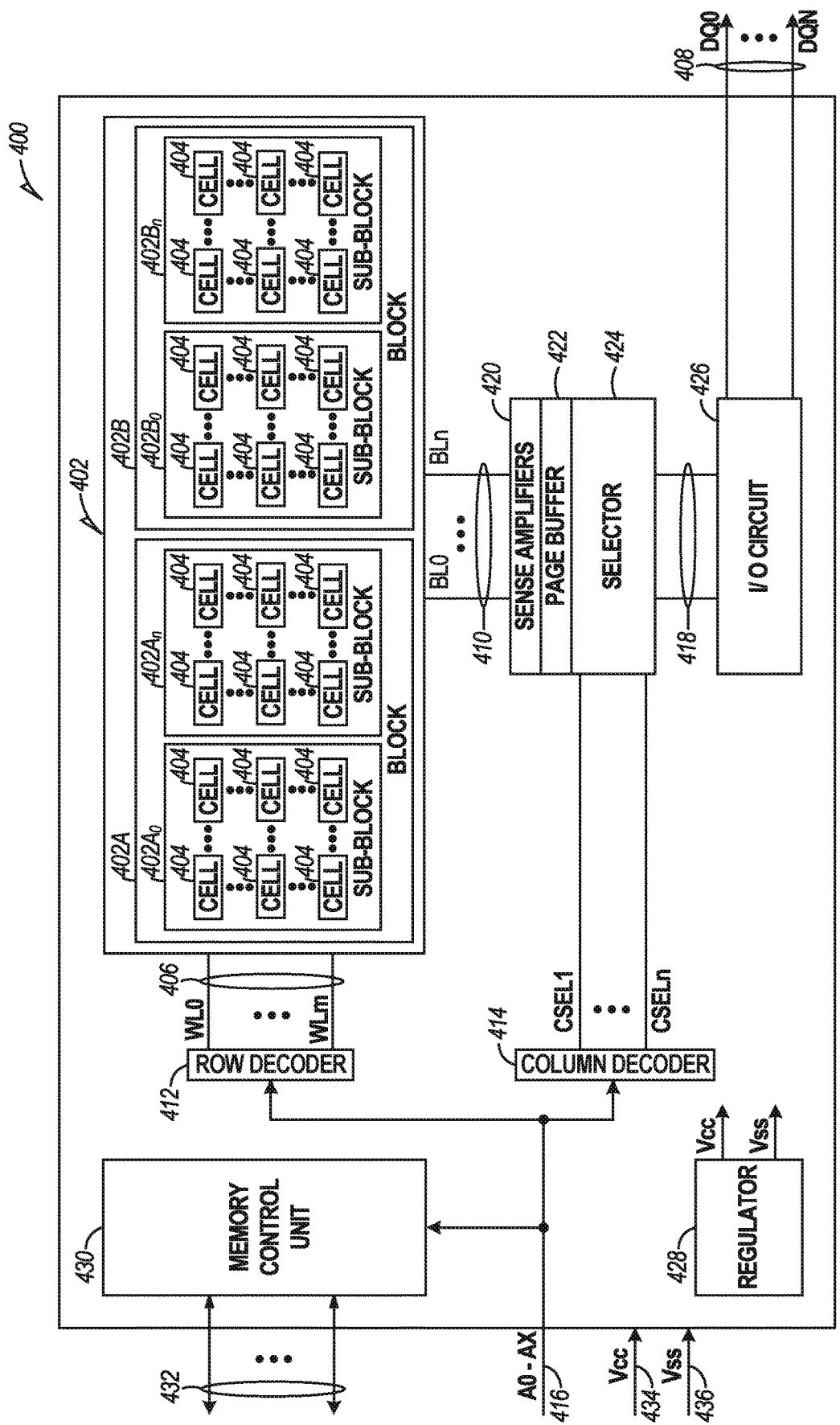
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DOG-DON) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
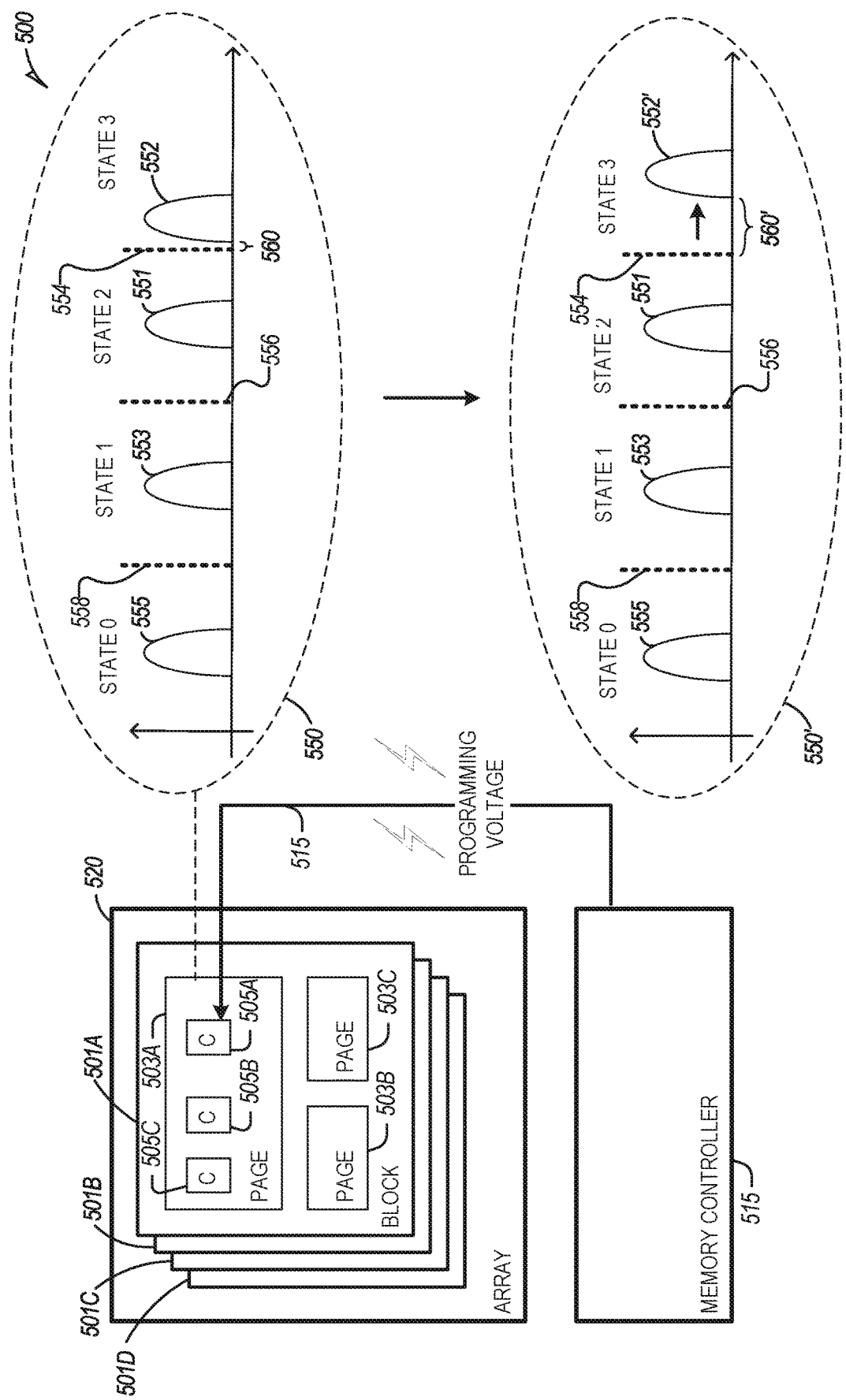
FIG. 5 illustrates an example environment including a memory array and memory controller and demonstrating techniques for correcting for power loss during a programming cycle.

FIG. 5 illustrates an example environment 500 including a memory array 520 and memory controller 515 and demonstrating techniques for correcting a physical page for power loss during a programming cycle. The memory array 520 comprises physical pages 503A, 503B, 503C. Each physical page 503A, 503B, 503C may comprise a number of cells. For example, physical page 503A includes example cells 505A, 505B, 505C. In various examples, cells 505A, 505B, 505C are MLC cells, capable of being programmed to one of four or more logical states. Each physical page 503A, 503B, 503C may store multiple logical pages, where the number of logical pages stored at a physical page is based on the number of logical states that can be assumed by the cells, such as 505A, 505B, 505C making up the physical pages 503A, 503B, 503C. For example, a physical page including cells that can be programmed to one of four logical states may store two logical pages. A physical page including cells that can be programmed to one of eight logical states may store three logical pages, etc. In some examples, cells of a physical page 503A, 503B, 503C may have control gates tied to a common word line, as described herein. Also, in some examples, physical pages may be arranged into one or more blocks 501A, 501B, 501C, 501D or other various units as described herein.

In the example of FIG. 5, the physical page 503A was being programmed at the time of an APL. As a result, cells 505A, 505B, 505C of the physical page 503A that were to be programmed to a first logical state corresponding to a highest threshold voltage may not have the correct threshold voltage distribution, while cells 505A, 505B, 505C that were to programmed to other states may have the correct threshold voltage distribution.

A threshold voltage plot 550 shows threshold voltage distributions 552, 551, 553, 555 for the physical page 503A corresponding to four logical states, labeled State 0, State 1, State 2, and State 3. In the example of FIG. 5, the logical state 3 corresponds to the highest threshold voltage distribution 552. The logical state 2 corresponds to the next-highest threshold voltage distribution 551, and so on.

As shown, the threshold voltage distributions 555, 553, and 551 corresponding to logical states 0, 1, and 2, respectively, are correctly positioned for the physical page 503A. For example, the threshold voltage distributions 555, 553, 551 are positioned roughly equidistant from the read levels 558, 556, and 554. On the other hand, the threshold voltage distribution 552 corresponding to logical state 3 is shifted low towards the read level 554. As a result, a read margin 560 between the read level 554 and the threshold voltage distribution is small, for example, smaller than a suitable safety margin. (In some examples, read margin 560 is negative, meaning that the threshold voltage distribution 552 overlaps the read level 554.) Because of the low read margin 560, cells programmed to logical state 3 may erroneously read at logical state 2. To remedy this, the memory controller 515 provides additional programming voltage to the cells, such as 505A, that are programmed to logical state 3. This may shift the threshold voltage distribution 552 to a new threshold voltage distribution 552' with a new read margin 560' that is suitably larger than the read margin 560 so as to reduce or eliminate erroneous reads.

Figure 6:
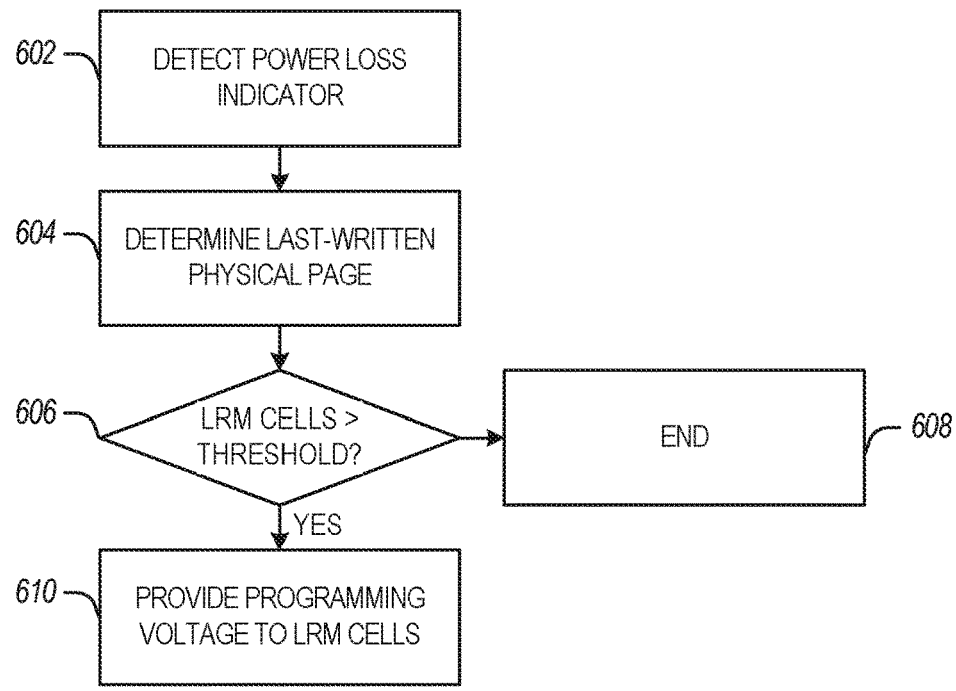
FIG. 6 illustrates a flow chart showing one example of a process flow that may be executed by a memory controller to correct for power loss during a programming cycle.

FIG. 6 illustrates a flow chart showing one example of a process flow 600 that may be executed by a memory controller (such as one of the memory controllers 115, 515) to correct for power loss during a programming cycle. At operation 602, the memory controller may detect a power loss indicator. A power loss indicator may indicate that a program cycle was in progress when the flash memory device suffered an APL. The power loss indicator may take any suitable form. In some examples, the memory controller may detect an APL sufficiently early to set a power loss indicator flag before losing power. The memory controller, then, may detect the power loss indicator flag. In some examples, the memory controller sets a programming flag when a programming cycle begins. When the programming cycle is complete, the memory controller clears the programming flag. Detecting the power loss indicator may include determining, on initialization of the flash memory device, that the programming flag is still set. This may be indicate, for example, that a programming cycle was in progress when the flash memory device powered down.

At operation 604, the memory controller may determine the last-written physical page. The last-written physical page is the last physical page that was programmed prior to detecting the power loss indicator. For example, if the last-written physical page was being programmed at the time of the APL, it may be insufficiently programmed. The memory controller may determine the last-written physical page in any suitable manner. In some examples, the memory controller tracks logical pages as they are assigned during a programming cycle. To determine the last-written physical page, the memory controller may determine the last-assigned logical page and then identify the physical page where the last-assigned logical page is stored.

At operation 606, the memory controller may determine whether the number of low read margin cells at the last-written physical page is less than a threshold. Low read margin cells may be cells at the last-written physical page that have a read margin less than a read margin threshold. In some examples, low read margin cells may be selected from cells at the last-written physical page that are at the logical state having the highest threshold voltage distribution. The memory controller may determine the number of low read margin cells in any suitable manner including, for example, as described with respect to FIG. 8.

If the number of low read margin cells at the last-written physical page is less than the threshold, it may indicate that the last-written physical page is properly programmed. Accordingly, the, the process flow 600 may end at operation 608. If the number of low read margin cells is greater than the threshold, it may indicate that the last-written physical page was not completely programmed. Accordingly, the memory controller may provide the programming voltage to at least the low read margin cells at operation 610. This may include, for example providing the programming voltage at a word line for the physical page while providing an inhibit voltage at the bit lines corresponding to cells of the physical page that do not have a low read margin. The programming voltage may be provided continuously or as a set of one or more pulses. For example, if a full programming cycle utilizes 16 pulses, a set of fewer than 16 pulses (e.g., 4 pulses) may be provided at operation 610. Providing the programming voltage to the low read margin cells may shift the threshold voltage distribution of the low read margin cells to increase their read margin and may, accordingly, recover the data stored thereon.

Figure 7:
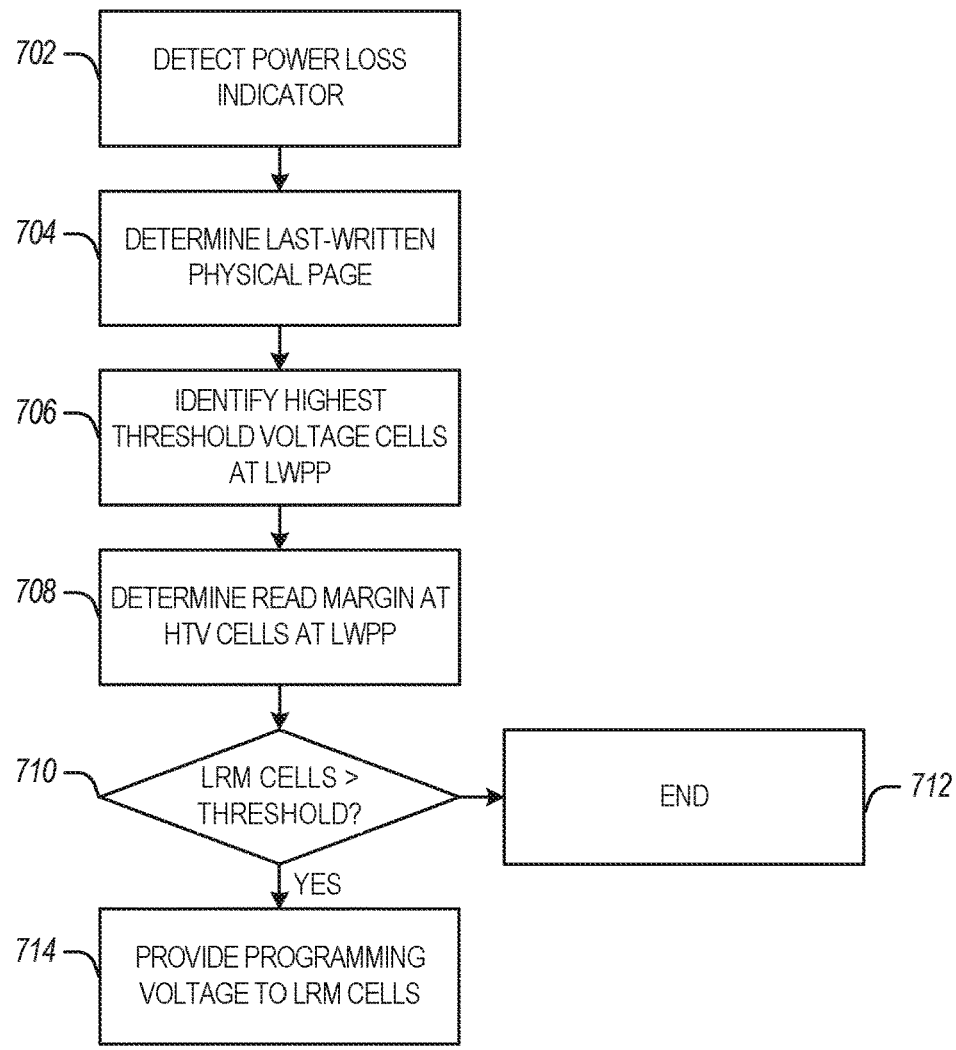
FIG. 7 illustrates a flow chart showing another example of a process flow 700 that may be executed by a memory controller to correct for power loss during a programming cycle.

FIG. 7 illustrates a flow chart showing another example of a process flow 700 that may be executed by a memory controller to correct for APL during a programming cycle. At operation 702, the memory controller may detect a power loss indicator, for example, in a manner similar to that described with respect to operation 602 above. At operation 704, the memory controller may determine a last-written physical page, for example, in a manner similar to that described with respect to operation 604 above.

At operation 706, the memory controller may identify cells at the last-written physical page that are programmed to a first logical state corresponding to the highest threshold voltage distribution at the physical page, referred to as first logical state cells. This may be done in any suitable manner. For example, the memory controller may read the physical page. Physical pages with read values indicating the first logical state may have been programmed to the first logical state. In some examples, the memory controller (e.g., an ECC engine thereof) may apply error correction to identify cells that are intended to be programmed to the first logical state, but are improperly programmed, for example, due to the APL.

At operation 708, the memory controller may determine the read margin for the first logical state cells. This may be done in any suitable manner including, for example, as described at FIG. 8. At operation 710, the memory controller may determine if the number of first logical state cells with a read margin less than a threshold read margin is greater than a threshold number. If not, it may indicate that the physical page is properly programmed and the process flow 700 may end at operation 712. If the number of first logical state cells with a read margin less than a threshold read margin is greater than the threshold, then the memory controller may provide a programming voltage to the first logical state cells with low read margin at operation 714. This may include, for example providing the programming voltage at a word line for the physical page while providing an inhibit voltage at the bit lines corresponding to cells of the physical page that are not first logical state cells with a low read margin. The programming voltage may be provided continuously or as a set of one or more pulses, as described herein.

Figure 8:
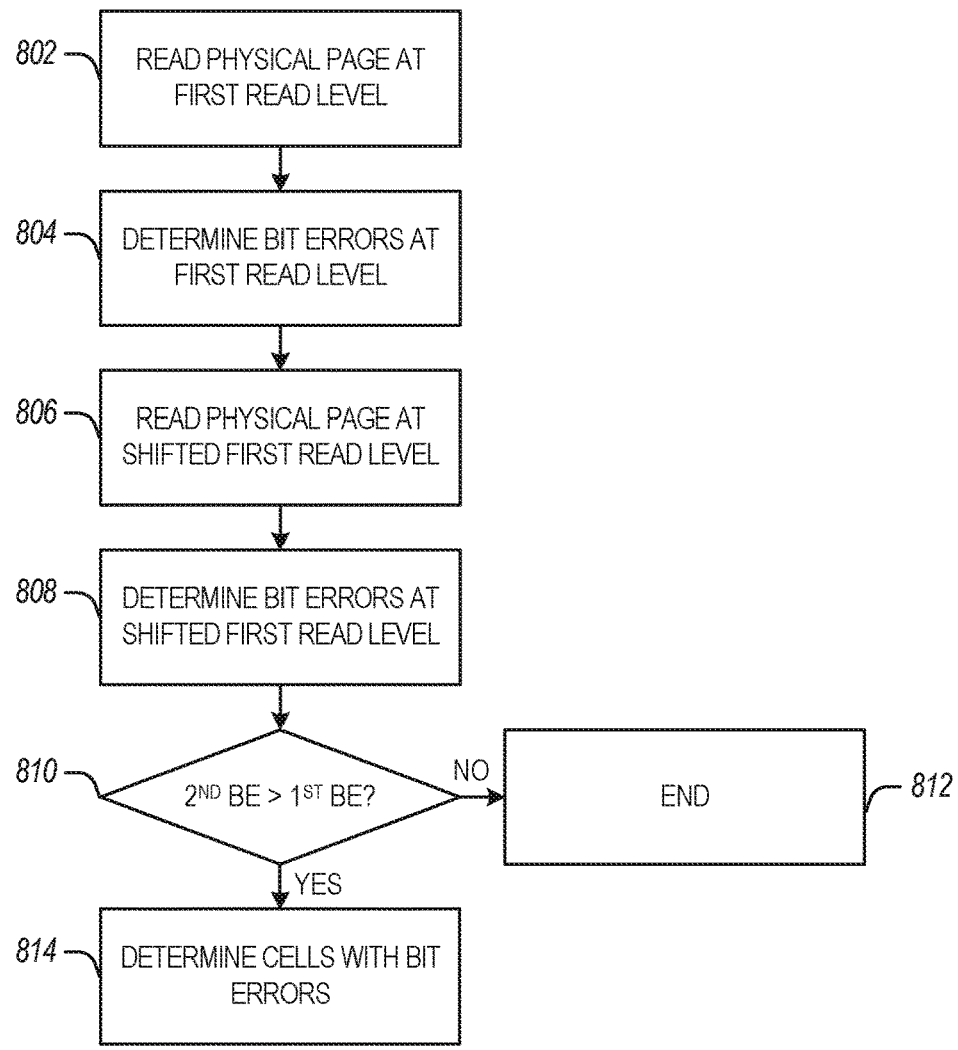
FIG. 8 illustrates a flow chart showing one example of a process flow that may be executed by a memory controller to identify low read margin cells at a physical page.

FIG. 8 illustrates a flow chart showing one example of a process flow 800 that may be executed by a memory controller to identify low read margin cells at a physical page. For example, the process flow 800 may be applied as part of the process flows 600 and 700 as described to identify cells that are candidates to receive the programming voltage. At operation 802, the memory controller may read the last-written physical page with an initial value for a first read level. The first read level may be positioned between a first threshold voltage distribution for the first logical state and a threshold voltage distribution for a second logical state indicated by a threshold voltage distribution that is less than the first threshold voltage distribution. At operation 804, the memory controller may determine bit errors for the read at operation 802. Determining bit errors may include, for example, counting the number of cells at the last-written physical page whose values were corrected by an ECC engine or other error correction component of the flash memory device.

At operation 806, the memory controller may read the last-written physical page again with a shifted value for the first read level. The shifted value may be shifted higher and thus closer to the threshold voltage distribution for the first logical state. If there are cells where the threshold voltage for the first logical stat is below the shifted value for the first read level, these cells may conduct current on their respective bit lines when read at the shifted value for the first read level. Accordingly, these cells may read at a second logical state corresponding to a lower threshold voltage distribution than the first logical state, resulting in a bit error at the cells. At operation 808, the memory controller may determine bit errors for the read at operation 806, for example, as described herein.

At operation 810, the memory controller may compare the number of bit errors from the first read at the initial value for the first read level and the number of bit errors from the second read at the shifted value for the first read level. If the number of bit errors from the second read is higher than the number of bit errors from the first read by more than a threshold amount, it may indicate that there are cells at the last-written physical page that are intended to be at the first logical state, but exhibit a low read margin. The memory controller may identify these low read margin cells at operation 814, for example, as cells that did not result in a bit error at the first read level, but did at the second read level. If the number of bit errors from the second read is not greater than the number of bit errors from the first read by more than the threshold amount, it may indicate that the physical page has adequate read margin for the first voltage threshold. The process may end at operation 812.

Figure 9:
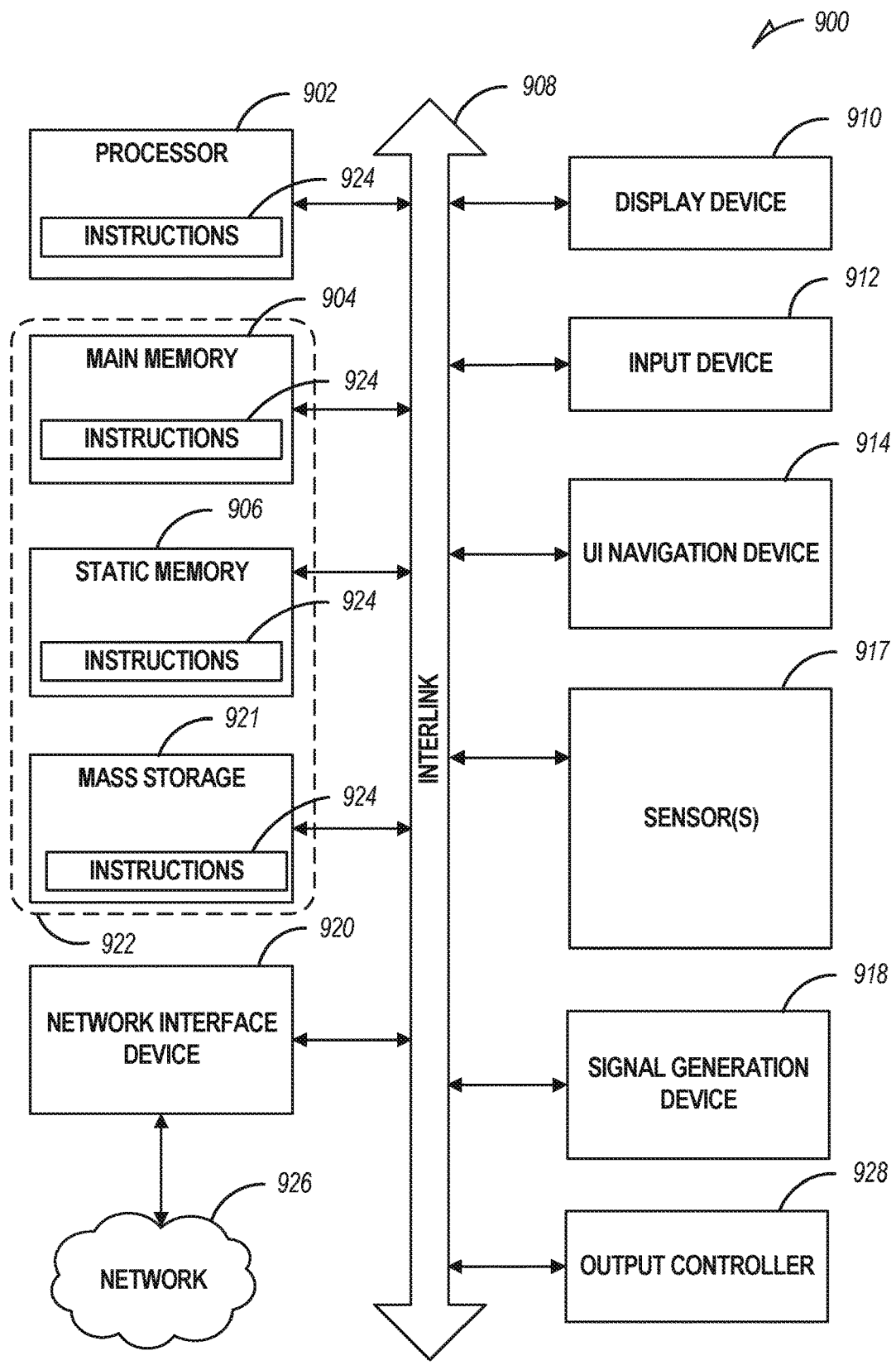
FIG. 9 is a block diagram illustrating an example of a machine upon which one or more embodiments may be implemented.

FIG. 9 illustrates a block diagram of an example machine 900 upon which any one or more of the techniques (e.g., methodologies) discussed herein may perform. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 900 (e.g., the host device 105, the memory device 110, etc.) may include a hardware processor 902 (e.g., a central processing unit (CPU), a graphics processing unit (GPU), a hardware processor core, or any combination thereof, such as the memory controller 115, etc.), a main memory 904 and a static memory $N^{th}$ y 906, some or all of which may communicate with each other via an interlink (e.g., bus) 908. The machine 900 may further include a display unit 910, an alphanumeric input device 912 (e.g., a keyboard), and a user interface (UI) navigation device 914 (e.g., a mouse). In an example, the display unit 910, input device 912 and UI navigation device 914 may be a touch screen display. The machine 900 may additionally include a storage device (e.g., drive unit) 916, a signal generation device 918 (e.g., a speaker), a network interface device 920, and one or more sensors 917, such as a global positioning system (GPS) sensor, compass, accelerometer, or other sensor. The machine 900 may include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 916 may include a machine readable medium 922 on which is stored one or more sets of data structures or instructions 924 (e.g., software) embodying or utilized by any one or more of the techniques or functions described herein. The instructions 924 may also reside, completely or at least partially, within the main memory 904, within static memory 906, or within the hardware processor 902 during execution thereof by the machine 900. In an example, one or any combination of the hardware processor 902, the main memory 904, the static memory 906, or the storage device 916 may constitute the machine readable medium 922.

While the machine readable medium 922 is illustrated as a single medium, the term "machine readable medium" may include a single medium or multiple media (e.g., a centralized or distributed database, or associated caches and servers) configured to store the one or more instructions 924.

The term "machine readable medium" may include any medium that is capable of storing, encoding, or carrying instructions for execution by the machine 900 and that cause the machine 900 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 924 (e.g., software, programs, an operating system (OS), etc.) or other data are stored on the storage device 921, can be accessed by the memory 904 for use by the processor 902. The memory 904 (e.g., DRAM) is typically fast, but volatile, and thus a different type of storage than the storage device 921 (e.g., an SSD), which is suitable for long-term storage, including while in an "off" condition. The instructions 924 or data in use by a user or the machine 900 are typically loaded in the memory 904 for use by the processor 902. When the memory 904 is full, virtual space from the storage device 921 can be allocated to supplement the memory 904; however, because the storage 921 device is typically slower than the memory 904, and write speeds are typically at least twice as slow as read speeds, use of virtual memory can greatly reduce user experience due to storage device latency (in contrast to the memory 904, e.g., DRAM). Further, use of the storage device 921 for virtual memory can greatly reduce the usable lifespan of the storage device 921.

In contrast to virtual memory, virtual memory compression (e.g., the Linux® kernel feature "ZRAM") uses part of the memory as compressed block storage to avoid paging to the storage device 921. Paging takes place in the compressed block until it is necessary to write such data to the storage device 921. Virtual memory compression increases the usable size of memory 904, while reducing wear on the storage device 921.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 924 may further be transmitted or received over a communications network 926 using a transmission medium via the network interface device 920 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 920 may include one or more physical jacks (e.g., Ethernet, coaxial, or phone jacks) or one or more antennas to connect to the communications network 926. In an example, the network interface device 920 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 900, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate, and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the control gate may form recesses, while the SGD may remain less recessed or even not recessed. These doping configurations may thus enable selective etching into the distinct tiers (e.g., SGS, control gate, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

Example 1 is a method of managing a NAND flash memory comprising a number of physical pages, comprising: detecting a power loss indicator at the NAND flash memory; identifying a last-written physical page; determining that the last-written physical page comprises more than a threshold number of low-read-margin cells; and after determining that the last-written physical page comprises more than the threshold number of low-read-margin cells, providing a programming voltage to at least the low-read-margin cells.

In Example 2, the subject matter of Example 1 optionally includes determining that a programming flag is set during an initialization of the NAND flash memory.

In Example 3, the subject matter of any one or more of Examples 1-2 optionally includes identifying a set of cells at the last-written physical page that are at a first logical level corresponding to a highest threshold voltage distribution, wherein determining that the last-written physical page comprises more than the threshold number of low-read-margin cells comprises determining that the set of cells at the last-written physical page comprises more than the threshold number of low-read-margin cells.

In Example 4, the subject matter of any one or more of Examples 1-3 optionally includes identifying a set of cells at the last-written physical page that are at a first logical level corresponding to a highest threshold voltage distribution, wherein providing the programming voltage to at least the low-read-margin cells comprises providing the programming voltage only to cells that are part of the set of cells.

In Example 5, the subject matter of any one or more of Examples 1-4 optionally includes identifying a set of cells at the last-written physical page that are at a first logical level corresponding to a highest threshold voltage distribution, wherein providing the programming voltage to at least the low-read-margin cells comprises providing the programming voltage only to low-read-margin cells that are part of the set of cells.

In Example 6, the subject matter of any one or more of Examples 1-5 optionally includes wherein identifying the last-written physical page comprises determining a last-assigned logical page of a block, and wherein the last-written physical page comprises the last-assigned logical page.

In Example 7, the subject matter of any one or more of Examples 1-6 optionally includes wherein the determining that the last-written physical page comprises more than a threshold number of low-read-margin cells comprises: identifying a set of cells at the last-written physical page that are at a first logical level corresponding to a highest threshold voltage distribution; reading the last-written physical page with a first read level for the first logical level; reading the last-written physical page with a second read level for the first logical level, wherein the second read level is higher than the first read level; and determining that a number of bit errors for the set of cells at the second read level is higher than the number of bit errors for the set of sells at the first read level by more than a threshold number of bit errors.

In Example 8, the subject matter of any one or more of Examples 1-7 optionally includes wherein providing the programming voltage to at least the low-read-margin cells comprises: identifying a set of cells at the last-written physical page that are at a first logical level corresponding to a highest threshold voltage distribution; providing an inhibit voltage to at a set of bit lines corresponding to a set of remaining cells at the last-written physical page that are not at the first logical level; and providing the programming voltage to a word line corresponding to the last-written physical page.

In Example 9, the subject matter of any one or more of Examples 1-8 optionally includes reading the last-written physical page with a second read level for a first logical level, wherein the first logical level corresponds to a highest threshold voltage distribution, and wherein the second read level is higher than a standard read level for the first logical level; identifying a set of cells at the last-written page, wherein cells of the set of cells returned a bit error when read at the second read level and are at the first logical level; providing an inhibit voltage to a set of bit lines corresponding to a set of remaining cells at the last-written physical page that are not part of the set of cells; and providing the programming voltage at a word line corresponding to the last-written physical page.

In Example 10, the subject matter of any one or more of Examples 1-9 optionally includes wherein providing the programming voltage to at least the low-read-margin cells comprises providing a number of programming pulses to at least the low-read-margin cells, wherein the number of programming pulses is less than a number of programming pulses of a programming cycle for the NAND flash memory.

Example 11 is a NAND flash memory comprising: a memory array comprising a number of physical pages, where each of the number of physical pages comprises a number of cells; and a memory controller programmed to perform operations comprising: detecting a power loss indicator; identifying a last-written physical page; determining that the last-written physical page comprises more than a threshold number of low-read-margin cells; and after determining that the last-written physical page comprises more than the threshold number of low-read-margin cells, providing a programming voltage to at least the low-read-margin cells.

In Example 12, the subject matter of Example 11 optionally includes wherein the memory controller is further programmed to perform operations comprising determining that a programming flag is set during an initialization of the NAND flash memory.

In Example 13, the subject matter of any one or more of Examples 11-12 optionally includes wherein the memory controller is further programmed to perform operations comprising identifying a set of cells at the last-written physical page that are at a first logical level corresponding to a highest threshold voltage distribution, wherein determining that the last-written physical page comprises more than the threshold number of low-read-margin cells comprises determining that the set of cells at the last-written physical page comprises more than the threshold number of low-read-margin cells.

In Example 14, the subject matter of any one or more of Examples 11-13 optionally includes wherein the memory controller is further programmed to perform operations comprising identifying a set of cells at the last-written physical page that are at a first logical level corresponding to a highest threshold voltage distribution, wherein providing the programming voltage to at least the low-read-margin cells comprises providing the programming voltage only to cells that are part of the set of cells.

In Example 15, the subject matter of any one or more of Examples 11-14 optionally includes wherein the memory controller is further programmed to perform operations comprising identifying a set of cells at the last-written physical page that are at a first logical level corresponding to a highest threshold voltage distribution, wherein providing the programming voltage to at least the low-read-margin cells comprises providing the programming voltage only to low-read-margin cells that are part of the set of cells.

In Example 16, the subject matter of any one or more of Examples 11-15 optionally includes wherein identifying the last-written physical page comprises determining a last-assigned logical page of a block, and wherein the last-written physical page comprises the last-assigned logical page.

In Example 17, the subject matter of any one or more of Examples 11-16 optionally includes wherein the determining that the last-written physical page comprises more than a threshold number of low-read-margin cells comprises: identifying a set of cells at the last-written physical page that are at a first logical level corresponding to a highest threshold voltage distribution; reading the last-written physical page with a first read level for the first logical level; reading the last-written physical page with a second read level for the first logical level, wherein the second read level is higher than the first read level; and determining that a number of bit errors for the set of cells at the second read level is higher than the number of bit errors for the set of sells at the first read level by more than a threshold number of bit errors.

In Example 18, the subject matter of any one or more of Examples 11-17 optionally includes wherein providing the programming voltage to at least the low-read-margin cells comprises: identifying a set of cells at the last-written physical page that are at a first logical level corresponding to a highest threshold voltage distribution; providing an inhibit voltage to a set of bit lines corresponding to a set of remaining cells at the last-written physical page that are not at the first logical level; and providing the programming voltage to a word line corresponding to the last-written physical page.

In Example 19, the subject matter of any one or more of Examples 11-18 optionally includes wherein the memory controller is further programmed to perform operations comprising: reading the last-written physical page with a second read level for a first logical level, wherein the first logical level corresponds to a highest threshold voltage distribution, and wherein the second read level is higher than a standard read level for the first logical level; identifying a set of cells at the last-written page, wherein cells of the set of cells returned a bit error when read at the second read level and are at the first logical level; providing an inhibit voltage to a set of bit lines corresponding to a set of remaining cells at the last-written physical page that are not part of the set of cells; and providing the programming voltage at a word line corresponding to the last-written physical page.

In Example 20, the subject matter of any one or more of Examples 11-19 optionally includes wherein providing the programming voltage to at least the low-read-margin cells comprises providing a number of programming pulses to at least the low-read-margin cells, wherein the number of programming pulses is less than a number of programming pulses of a programming cycle for the NAND flash memory.

Example 21 is a NAND flash memory comprising: a memory array comprising a number of blocks, wherein a first block of the number of blocks comprises a number of physical pages, wherein each physical page of the number of physical pages comprises a set of cells, wherein each cell of the set of cells is programmable to one of at least four logical levels, and wherein each of the at least four logical levels is indicated by a respective threshold voltage distribution; a memory controller programmed to perform operations comprising: detecting a power loss indicator; identifying a last-written physical page; reading the last-written page at a first read voltage between a highest threshold voltage distribution indicating one of the logical levels of the at least four logical levels and a next-highest threshold voltage distribution indicating a second one of the at least four logical level; reading the last-written page at a second read voltage that is higher than the first read voltage and is also between the highest threshold voltage distribution and the next highest threshold voltage distribution; determining that a number of bit errors at the second read voltage is larger than a number of bit errors at the first read voltage; and providing a programming voltage to at least a portion of cells at the last-written page that exhibited a bit error at the second read voltage.

Example 22 is a device readable storage medium, that provides instructions that, when executed by a controller of a memory device, optimizes voltage read level calibration in the memory device, wherein the instructions cause the controller to perform operations according to any of the techniques of Examples 1-21.

Example 23 is an apparatus comprising respective means for performing any of the methods or techniques of Examples 1-21.

Example 24 is a system, apparatus, or device to perform the operations of any of Examples 1-21.

Example 25 is a tangible machine readable medium embodying instructions to perform or implement the operations of any of Examples 1-21.

Example 26 is a method to perform the operations of any of Examples 1-21.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method of managing a memory device comprising a number of physical pages with each of the physical pages comprising a number of memory cells, comprising:
   detecting a power loss at the memory device;
   in response to detecting the power loss at the memory device, identifying a last-written physical page, the last-written physical page being a last physical page of the memory device that was written to before the detected power loss;
   determining a number of low-read-margin memory cells at the last-written physical page, wherein a first memory cell of the low-read-margin memory cells has a difference between a memory cell threshold voltage for the first memory cell and a read level for the last-written physical page that is less than a threshold difference;

determining whether the number of low-read-margin memory cells is greater than a threshold number of low-read-margin memory cells; and in response to determining that the number of low-read-margin memory cells is greater than the threshold number of low-read-margin memory cells, providing a programming voltage to a subset of memory cells of the last-written physical page, wherein the subset of memory cells comprises the low-read-margin memory cells.

2. The method of claim 1, further comprising:

detecting a second power loss at the memory device;

in response to detecting the second power loss at the memory device, identifying a second last-written physical page, the second last-written physical page being a last physical page of the memory device that was written before the detected second power loss;

determining a number of low-read-margin memory cells at the second last-written physical page;

determining whether the number of low-read-margin memory cells at the second last-written physical page is greater than the threshold number of low-read-margin memory cells; and in response to determining that the number of low-read-margin memory cells at the second last-written physical page is not greater than the threshold number of low-read-margin memory cells, determining that the second power loss has caused the memory device to be improperly programmed.

3. The method of claim 1, wherein detecting the power loss at the memory device comprises determining that a programming flag is set during an initialization of the memory device, the programming flag being set during the initialization indicating that a programming cycle was in progress during a power loss.

4. The method of claim 1, further comprising identifying memory cells of the last-written physical page that are at a first logical level corresponding to a highest threshold voltage distribution, wherein the low-read-margin memory cells are selected from the memory cells at the first logical level.

5. The method of claim 1, further comprising identifying memory cells of the last-written physical page that are at a first logical level corresponding to a highest threshold voltage distribution, wherein providing the programming voltage to the subset of memory cells of the last-written physical page comprises providing the programming voltage only to the memory cells of the last-written physical page that are at the first logical level.

6. The method of claim 1, further comprising identifying memory cells of the last-written physical page that are at a first logical level corresponding to a highest threshold voltage distribution, wherein providing the programming voltage to the subset of memory cells of the last-written physical page comprises providing the programming voltage only to low-read-margin memory cells that are part of the memory cells of the last-written physical page that are at the first logical level.

7. The method of claim 1, wherein identifying the last-written physical page comprises determining a last-assigned logical page of a block, and wherein the last-written physical page comprises the last-assigned logical page.

8. The method of claim 1, wherein the determining the number of low-read-margin memory cells comprises:

identifying memory cells of the last-written physical page that are at a first logical level corresponding to a highest threshold voltage distribution;

reading the last-written physical page with a first read level for the first logical level;

reading the last-written physical page with a second read level for the first logical level, wherein the second read level is higher than the first read level; and determining that a number of bit errors from the reading at the second read level is higher than a number of bit errors from the reading at the first read level by more than a threshold number of bit errors.

9. The method of claim 1, wherein providing the programming voltage to the subset of memory cells of the last-written physical page comprises:

identifying memory cells of the last-written physical page that are at a first logical level corresponding to a highest threshold voltage distribution;

providing an inhibit voltage to at a bit line corresponding to a first remaining memory cell of the last-written physical page that is not at the first logical level; and providing the programming voltage to a word line corresponding to the last-written physical page.

10. The method of claim 1, further comprising:

reading the last-written physical page with a second read level for a first logical level, wherein the first logical level corresponds to a highest threshold voltage distribution, and wherein the second read level is higher than a standard read level for the first logical level;

identifying memory cells of the last-written page that returned a bit error when read at the second read level and are at the first logical level;

providing an inhibit voltage to a bit line corresponding to a first remaining memory cell of the last-written physical page that is at the first logical level and did not return a bit error when read at the second read level; and providing the programming voltage at a word line corresponding to the last-written physical page.

11. The method of claim 1, wherein providing the programming voltage to at least the low-read-margin memory cells comprises providing a number of programming pulses to at least the low-read-margin memory cells, wherein the number of programming pulses is less than a number of programming pulses of a programming cycle for the memory device.

12. A memory device comprising:

a memory array comprising a number of physical pages, where each of the number of physical pages comprises a number of memory cells; and a memory controller including a processor configured to execute instructions stored in the memory device, wherein the instructions when executed by the processor cause the processor to perform operations comprising:

detecting a power loss at the memory device;

in response to detecting the power loss at the memory device, identifying a last-written physical page, the last-written physical page being a last physical page of the memory device that was written to before the detected power loss;

determining a number of low-read-margin memory cells at the last-written physical page, wherein a first memory cell of the low-read-margin memory cells has a difference between a memory cell threshold voltage for the first memory cell and a read level for the last-written physical page that is less than a threshold difference;

determining whether the number of low-read-margin memory cells is greater than a threshold number of low-read-margin memory cells; and in response to determining that the number of low-read-margin memory cells is greater than the threshold number of low-read-margin memory cells, providing a programming voltage to a subset of memory cells of the last-written physical page, wherein the subset of memory cells comprises the low-read-margin memory cells.

13. The memory device of claim 12, the operations further comprising:

detecting a second power loss at the memory device;

in response to detecting the second power loss at the memory device, identifying a second last-written physical page, the second last-written physical page being a last physical page of the memory device that was written before the detected second power loss;

determining a number of low-read-margin memory cells at the second last-written physical page;

determining whether the number of low-read-margin memory cells at the second last-written physical page is greater than the threshold number of low-read-margin memory cells; and in response to determining that the number of low-read-margin memory cells at the second last-written physical page is not greater than the threshold number of low-read-margin memory cells, determining that the second power loss has caused the memory device to be improperly programmed.

14. The memory device of claim 12, wherein detecting the power loss at the memory device comprises determining that a programming flag is set during an initialization of the memory device, the programming flag being set during the initialization indicating that a programming cycle was in progress during a power loss.

15. The memory device of claim 12, the operations further comprising identifying memory cells of the last-written physical page that are at a first logical level corresponding to a highest threshold voltage distribution, wherein the low-read-margin memory cells are selected from the memory cells at the first logical level.

16. The memory device of claim 12, the operations further comprising identifying memory cells of the last-written physical page that are at a first logical level corresponding to a highest threshold voltage distribution, wherein providing the programming voltage to the subset of memory cells of the last-written physical page comprises providing the programming voltage only to the memory cells of the last-written physical page that are at the first logical level.

17. The memory device of claim 12, the operations further comprising identifying memory cells of the last-written physical page that are at a first logical level corresponding to a highest threshold voltage distribution, wherein providing the programming voltage to the subset of memory cells of the last-written physical page comprises providing the programming voltage only to low-read-margin memory cells that are part of the memory cells of the last-written physical page that are at the first logical level.

18. A machine readable medium comprising instructions thereon that, when executed by a processor, cause the processor to perform operations comprising:

detecting a power loss at a memory device;

in response to detecting the power loss at the memory device, identifying a last-written physical page, the last-written physical page being a last physical page of the memory device that was written to before the detected power loss;

determining a number of low-read-margin memory cells at the last-written physical page, wherein a first memory cell of the low-read-margin memory cells has a difference between a memory cell threshold voltage for the first memory cell and a read level for the last-written physical page that is less than a threshold difference;

determining whether the number of low-read-margin memory cells is greater than a threshold number of low-read-margin memory cells; and in response to determining that the number of low-read-margin memory cells is greater than the threshold number of low-read-margin memory cells, providing a programming voltage to a subset of memory cells of the last-written physical page, wherein the subset of memory cells comprises the low-read-margin memory cells.

19. The medium of claim 18, wherein the operations further comprise:

detecting a second power loss at the memory device;

in response to detecting the second power loss at the memory device, identifying a second last-written physical page, the second last-written physical page being a last physical page of the memory device that was written before the detected second power loss;

determining a number of low-read-margin memory cells at the second last-written physical page;

determining whether the number of low-read-margin memory cells at the second last-written physical page is greater than the threshold number of low-read-margin memory cells; and in response to determining that the number of low-read-margin memory cells at the second last-written physical page is not greater than the threshold number of low-read-margin memory cells, determining that the second power loss has caused the memory device to be improperly programmed.

20. The medium of claim 18, wherein detecting the power loss at the memory device comprises determining that a programming flag is set during an initialization of the memory device, the programming flag being set during the initialization indicating that a programming cycle was in progress during a power loss.

* * * * *